(12) United States Patent
Sawai et al.

(10) Patent No.: US 6,538,348 B2
(45) Date of Patent: Mar. 25, 2003

(54) STAGE DEVICE CAPABLE OF MOVING AN OBJECT TO BE POSITIONED PRECISELY TO A TARGET POSITION

(75) Inventors: Hiroyuki Sawai, Nabari (JP); Hiroshi Ishii, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 52 days.

(21) Appl. No.: 09/788,448

(22) Filed: Feb. 21, 2001

(65) Prior Publication Data

US 2001/0019229 A1 Sep. 6, 2001

(30) Foreign Application Priority Data

Feb. 21, 2000 (JP) ........................................ 2000-042676
Mar. 1, 2000 (JP) ........................................ 2000-055243

(51) Int. Cl.$^7$ .............................................. H02K 41/00
(52) U.S. Cl. ........................ 310/12; 74/790.09; 318/625
(58) Field of Search .......................... 310/12; 318/38, 318/135, 560, 625, 648, 649; 74/471 XY, 479.01, 479.09, 490.03, 490.08; 108/137–143; 250/492.1, 492.2, 492.22; 355/53, 77

(56) References Cited

U.S. PATENT DOCUMENTS 5,208,497 A  5/1993 Ishii et al. ..................... 310/12
5,996,437 A  * 12/1999 Novak et al. ............. 74/490.09
6,028,376 A  2/2000 Osanai et al. .................. 310/12
6,127,790 A  * 10/2000 Colby et al. .................. 318/38
6,271,640 B1  * 8/2001 Lee ............................. 318/560

FOREIGN PATENT DOCUMENTS

| JP | A863231 | 3/1996 |
| JP | B2-2651732 | 5/1997 |
| JP | A11168064 | 6/1999 |
| JP | A11243132 | 9/1999 |

* cited by examiner

*Primary Examiner*—Karl Tamai
*Assistant Examiner*—Judson H. Jones
(74) *Attorney, Agent, or Firm*—Birch, Stewart, Kolasch & Birch, LLP (57) ABSTRACT

In a state that a wafer stage is not positioned in the center of the Y-direction traveling range, thrusts Fa, Fb supplied from a pair of linear motors to a Y-direction stage are made different and the Y-direction stage is moved in the X direction so that moments Ma, Mb about the centroid of the Y-direction stage by the thrusts Fa, Fb cancel each other. Since the moments Ma, Mb about the centroid generated by the thrusts cancel each other and the thrusts do not act as forces for rotating the Y-direction stage, the Y-direction stage is not deflected in a yawing direction. Such a stage device as constructed above can prevent deflection in a yawing direction due to displacement of the centroid position of an object to be positioned or a stage and precisely move the object to be positioned to a target position.

10 Claims, 8 Drawing Sheets

STAGE DEVICE CAPABLE OF MOVING AN OBJECT TO BE POSITIONED PRECISELY TO A TARGET POSITION

BACKGROUND OF THE INVENTION

The present invention relates to a stage device which is used in an aligner used in a lithography process in manufacture of a semiconductor element or the like, a machine tool used for machining of works and a precision mechanical equipment such as a measuring device or the like for measuring a shape of an object to be measured and moves an object to be positioned such as a work or the like to a target position.

As a device for moving an object to be positioned to a target position, for example, an aligner for use in a lithography process, in which a mask pattern is transferred onto a substrate such as a wafer or the like, in manufacture of a semiconductor element, liquid crystal display element, thin film magnetic head or the like needs to precisely position the wafer, which is an object to be positioned, to a predetermined exposure position. Therefore, the aligner is provided with a wafer stage on which a wafer is mounted and a stage device having a travel mechanism for supplying the wafer stage with thrusts in two directions (X and Y directions) perpendicular to each other.

Thus, the thrusts generated in the travel mechanism must be supplied to the object to be positioned in a highly precise manner without generating a backlash in precision mechanical equipment where an object to be positioned needs to be precisely aligned to a target position. Occurrence of vibration or the like needs to be prevented when the object to be positioned travels.

Therefore, in general, a linear motor, which linearly moves a movable element in no contact with a stator, is used in a conventional travel mechanism constituting a stage device for precision mechanical equipment.

In a constitution disclosed in Japanese Patent Laid-Open Publication No. Hei 11-243132, for example, in a device where thrusts generated by a linear motor are acted on both ends of a stage supported on a base via a static air pressure bearing to move a stage, an inertial body traveling in parallel to the stage is provided on the base. When the stage travels, this inertial body is moved so that a force for canceling a reaction force acting on the base via the linear motor is acted on the base, thereby preventing displacement of the centroid position of the base including the stage and the inertial body. Thus, vibration of the stage is prevented.

In a constitution disclosed in Japanese Patent Laid-Open Publication No. Hei 11-168064, a surface plate is supported on a base via a vibration isolating table or the like. An X-stage provided with a Y-guide bar and a Y-guide bar carrier is provided movably along an X-guide bar on the surface plate. This X-stage is driven in the X direction via an X-axis linear motor and the stators of the X-axis linear motor are supported so that the stators can travel in the X direction on the surface plate via a direct acting guide. Thus, a damping force for canceling a reaction force when the X-stage is driven is given to the stators by an X-damping member attached to a damping frame fixed on the base.

A bottom surface and an outer surface of a first Y-guide bar carrier are provided with air exhaust nozzles each constituting a bearing. Furthermore, a pre-load mechanism such as a magnet, vacuum pocket or the like is installed in the vicinity of these air exhaust nozzles. The first Y-guide bar carrier can travel in the X direction maintaining a certain gap with a surface of the surface plate and a side surface of an X-guide bar while being confined in the Z direction and Y direction. Similarly, an air exhaust nozzle constituting an air bearing and a pre-load mechanism such as a magnet, vacuum pocket or the like are also installed in a bottom surface of a second Y-guide bar carrier. Thus, the Y-guide bar carrier can also travel in the X direction maintaining a certain gap with the top surface of the surface plate while being confined.

With this constitution, when the movable section travels, occurrence of a moment, deforming force and the like is prevented and thereby vibration can be prevented.

In a constitution disclosed in Japanese Patent Laid-Open Publication No. Hei 8-63231, a movable stage device uses a rectifying linear motor. The linear motor moves a guideless stage in one linear motion direction and allows the stage to perform a fine yaw rotation in a plane. A carrier/jogging element holding a single voice coil motor is controlled so as to generally follow the stage traveling in the linear motion direction. A voice coil motor is given an electromagnetic force in a plane so that the stage is allowed to perform a fine motion in a direction perpendicular to the linear motion direction to achieve an appropriate alignment. Furthermore, one element (coil or magnet) of the rectifying linear motor is provided on a driving frame which can travel freely on the plane. The driving frame is driven by a reaction force so that the centroid position of the device is maintained. In this constitution, when one linear motor is used, two voice coil motors are used to correct the yaw rotation.

In a conventional stage device, however, when an object to be positioned is moved in one of two directions perpendicular to each other and then moved in the other remaining direction, the object to be positioned may not be positioned in the driving center of a drive mechanism (central position between the linear motors when the drive mechanism is constituted by a pair of linear motors in parallel in the other remaining direction). Also, the centroid position of the object to be positioned in a direction perpendicular to two respective traveling directions may not be positioned in the driving center of the drive mechanism depending on the shape of the object to be positioned. When the object to be positioned travels in this state, the object to be positioned is deflected in a yawing or pitching direction and thereby the object to be positioned cannot be moved precisely to a target position.

SUMMARY OF THE INVENTION

Accordingly, an object of the present invention is to provide a stage device which can prevent deflection of an object to be positioned and a stage in a yawing or pitching direction due to displacement of the centroid position thereof when the object to be positioned travels and move the object to be positioned precisely to a target position and to provide a stage device which can prevent vibration of a support due to movement of the stage and move the object to be positioned precisely to a target position.

The present invention is provided with the following constitutions to achieve the above object.

(1) A stage device which moves a stage on a support by thrusts generated by a pair of thrust generating means in parallel to a stage traveling direction is characterized in that there is provided a control section for moving a stage in a state that moments acted on the stage around the centroid are balanced by the thrusts supplied from each of the pair of thrust generating means.

In this constitution, when the stage travels, the moments about the centroid of the stage are balanced. Therefore, the stage traveling direction is not deflected in a yawing direction and thereby the object to be positioned can be precisely moved to a target position.

(2) The stage device is characterized in that the control section relatively changes the thrust generated by each of the pair of thrust generating means depending on the centroid position of the stage in a direction perpendicular to its traveling direction.

In this constitution, the respective thrusts of the pair of thrust generating means are determined so that the moments about the centroid of the stage are balanced depending on the centroid position of the stage in a direction perpendicular to its traveling direction when the stage travels. Therefore, irrespective of the centroid position of the stage in a direction perpendicular to its traveling direction, the moments acted on the stage about its centroid are balanced by the respective thrusts from the pair of thrust generating means and thereby the stage traveling direction is not deflected to a yawing direction.

(3) The stage device is characterized in that the control section allows the centroid position of the stage to coincide with a central position in a direction perpendicular to the traveling direction before moving the stage.

In this constitution, the stage travels in a state that the centroid position of the stage is positioned at the center in a direction perpendicular to the traveling direction. Therefore, moments acted on the stage about its centroid are balanced by the respective thrusts from the pair of thrust generating means at all times by keeping the respective thrusts from the pair of thrust generating means equal to each other. Thus, the stage traveling direction is not deflected in a yawing direction.

(4) The stage device is characterized in that the control section calculates a thrust Fa to be generated by the thrust generating means on a distance La side and a thrust Fb to be generated by the thrust generating means on a distance Lb side by the following equations:

$Fa=F \times Lb/(La+Lb)$ $Fb=F \times La/(La+Lb)$ where F is a thrust required to move the stage and La and Lb are distances from the centroid position of the stage to positions where the respective thrusts of the pair of thrust generating means act, respectively.

In this constitution, the thrusts Fa and Fb of the respective thrust generating means required to move the stage are calculated based on the distances La and Lb from the centroid position of the stage to positions where the respective thrusts of the pair of thrust generating means act. Therefore, thrusts required to move the stage are distributed to the pair of thrust generating means in a state that moments about the centroid obtained as a product of thrusts of the respective thrust generating means and a distance from the centroid position to action points of the thrusts in the stage are balanced.

(5) The stage device is characterized in that an object to be positioned is placed on the stage movably in one of two directions perpendicular to each other while the stage travels in the other direction. There is provided a position detecting sensor for detecting a position of the object to be positioned in the stage. The control section calculates a value of current to be supplied to each of the pair of thrust generating means for supplying thrusts in the other direction to the stage based on a detection result of the position detecting sensor.

In this constitution, the value of current for the pair of thrust generating means for supplying thrusts to the stage is calculated based on the detection result in the position of the object to be positioned in the direction perpendicular to the stage traveling direction. Therefore, a thrust depending on the value of current calculated based on the centroid position of the stage determined by the position of the object to be positioned is supplied to the stage from each of the pair of thrust generating means. Thus, the stage travels in a state that the moments about the centroid are balanced.

(6) The stage device is characterized in that the centroid position of the object to be positioned, the centroid position of the stage, the action point of the moving force against the object to be positioned and the action point of the thrust against the stage exist in the same plane having a normal line perpendicular to the traveling direction of the object to be positioned and the stage traveling direction.

In this constitution, the centroid position and the action point of the moving force of the object to be positioned and the centroid position and the action point of the thrust of the stage are positioned in the same plane having a normal line perpendicular to the traveling direction of the object to be positioned and the stage traveling direction. Therefore, the moving force supplied to the object to be positioned and the thrust supplied to the stage do not generate a moment in a pitching direction in the object to be positioned.

(7) The stage device is characterized in that the pair of thrust generating means for supplying thrusts to the stage contains a movable element fixed to the stage and stators attached to a support movably in the stage traveling direction.

In this constitution, the stators of the thrust generating means for supplying thrusts to the stage are attached to the support movably in the stage traveling direction. Therefore, when the stage travels, reaction forces acted on the stators of the thrust generating means do not act on the support and thereby no vibration is generated in the support.

(8) A stage device for linearly moving a stage via a guide fixed on a base is characterized in that there are provided a first thrust generating means for supplying a thrust depending on the centroid position of the stage to each of both end portions thereof in a direction perpendicular to the stage traveling direction and a second thrust generating means for acting a force on the base opposite to a reaction force transmitted from the first thrust generating means to the base when the stage travels.

In this constitution, a thrust depending on the centroid position of the stage is supplied to both ends of the stage and a force opposite to a reaction force transmitted to the base acts on the base when the stage travels. Therefore, when the stage travels, a force in a yawing direction does not act on the stage by supplying each of the both ends of the stage with a thrust inversely proportional to the distance to the centroid position of the stage. Also, a reaction force transmitted to the base in the yawing direction is canceled by the movement of the stage and thereby the base does not cause yawing.

(9) The stage device is characterized in that the first thrust generating means determines or distributes a thrust Fa to be supplied to the end portion on the distance La side and a thrust Fb to be supplied to the end portion on the distance Lb side by the following equations:

$Fa=F \times Lb/(La+Lb)$ $Fb=F \times La/(La+Lb)$ where F is a thrust required to move the stage and La and Lb are distances from the centroid position of the stage to action points of the thrusts in both end portions of the stage.

In this constitution, a thrust inversely proportional to the distance to the centroid position of the stage is supplied to each of the both ends of the stage. Therefore, the stage does not yaw when the stage travels.

(10) The stage device is characterized in that the second thrust generating means is an inertial body which freely moves in a plane in parallel to a plane on which the stage travels in the base and receives a thrust supplied from the base.

In this constitution, the inertial body travels in a plane in parallel to the plane on which the stage travels depending on a reaction force acting on the base when the stage travels. Therefore, when the stage travels, the inertial body travels relatively to the base and a force opposite to the reaction force by the movement of the stage acts from the inertial body on the base. Thus, the base does not rotate in a yawing direction.

(11) The stage device is characterized in that the second thrust generating means travels without contacting the base in a plane in parallel to the plane on which the stage travels.

In this constitution, the centroid position of the base is not moved in a plane in parallel to the plane on which the stage travels by acting a force opposite to the reaction force when the stage travels on the base. When yawing of the base is controlled by acting a force opposite to the reaction force, it is not necessary to consider movement of the centroid position of the base by acting a force opposite to the reaction force.

(12) The stage device is characterized in that the second thrust generating means are disposed at two sites of the base and receive a supply of thrusts Fc, Fd determined or distributed by the following equations:

$$Fc = -Fx\{(Ld+Le)/(Lc+Ld)\}$$

$$Fd = -Fx\{(Lc-Le)/(Lc+Ld)\}$$

where Fx is a thrust required to move the stage, Le is a distance from the centroid position of the stage to the centroid position of the base and Lc and Ld are distances from the thrust generating positions in the second thrust generating means to the centroid position of the base.

In this constitution, moments about the centroid acting on the base by the movement of the stage are canceled by the movement of the inertial body. Therefore, when the stage travels, the moments about the centroid of the base are balanced and thereby the base does not rotate in a yawing direction by the moments about the centroid of the base.

(13) The stage device is characterized in that the stage is composed of an X-direction stage and Y-direction stage traveling in directions perpendicular to each other. The first thrust generating means is composed of a first X-direction thrust generating means and a first Y-direction thrust generating means for generating a thrust to be supplied to each of the X-direction stage and the Y-direction stage. The second thrust generating means is composed of a second X-direction thrust generating means and a second Y-direction thrust generating means for acting a force opposite to reaction forces transmitted to the base from the first X-direction thrust generating means and the first Y-direction thrust generating means on the base. There are provided first to fourth supports holding the base at four sites in a plane in parallel to the plane on which the X-direction stage and the Y-direction stage travel.

Bearing powers Fα, Fβ, Fγ, Fδ of the first to fourth supports are determined and distributed by the following equations:

$$F\alpha = \{L\beta/(L\alpha+L\beta)\}\{L\delta/(L\gamma+L\delta)\}W$$

$$F\beta = \{L\alpha/(L\alpha+L\beta)\}\{L\delta/(L\gamma+L\delta)\}W$$

$$F\gamma = \{L\alpha/(L\alpha+L\beta)\}\{L\gamma/(L\gamma+L\delta)\}W$$

$$F\delta = \{L\beta/(L\alpha+L\beta)\}\{L\gamma/(L\gamma+L\delta)\}W$$

where W is a weight of the base including the X-direction stage and Y-direction stage, Lγ and Lδ are distances from the centroid position of the base to the two positions where the supports are disposed in the traveling direction of the X-direction stage and Lα and Lδ are distances from the centroid position of the base to the two positions where the supports are disposed in the traveling direction of the Y-direction stage.

In this constitution, the respective bearing powers of the four supports for supporting the base are determined or distributed based on the distance from each support to the centroid position of the base. Therefore, the moments about the centroid of the base generated by the movement of the stage in a plane perpendicular to the plane on which the stage travels are canceled by the bearing powers of the supports depending on the centroid position of the base when the stage travels. Thus, the base does not rotate in a pitching direction.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBIDIMENTS

The present invention is described in detail below with reference to embodiments shown in the drawings.

Figure 1:
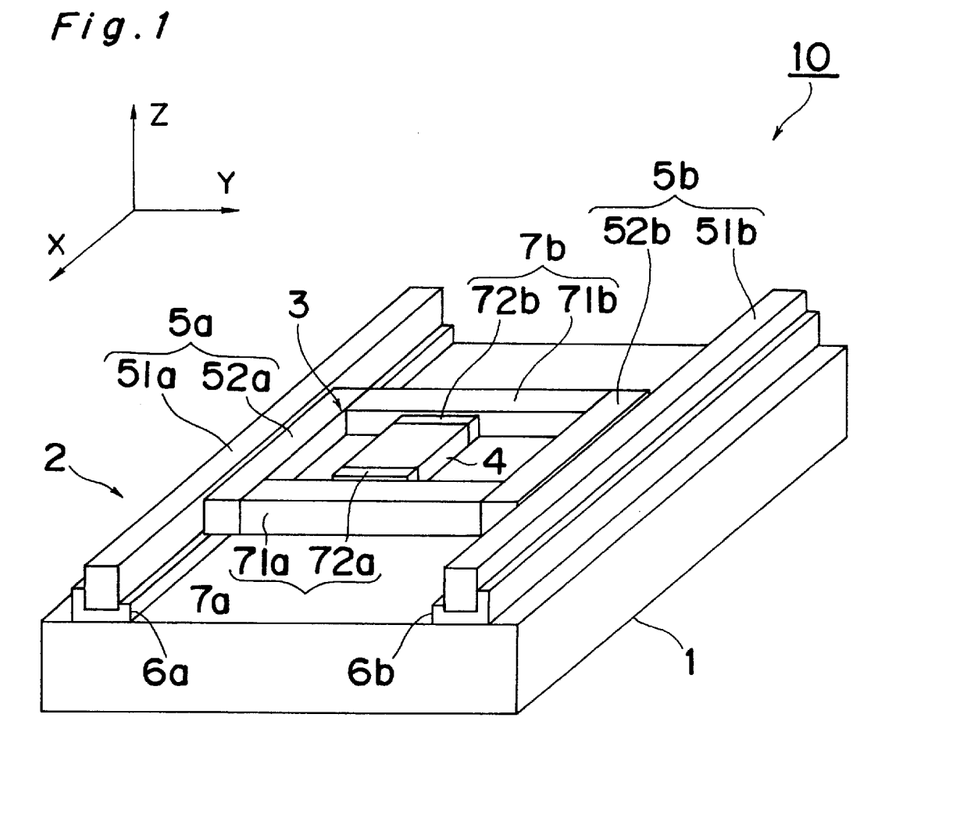
FIG. 1 is an external view showing a constitution of a stage device according to an embodiment of the invention.

FIG. 1 is an external view showing a constitution of a stage device according to an embodiment of the invention. A stage device 10 is applied to an aligner in use for a lithography process, in which a mask pattern is transferred to a substrate such as a wafer or the like, in manufacture of a semiconductor element, liquid crystal display element, thin film magnetic head or the like. A wafer is moved to an arbitrary target position in a predetermined range in an X direction and a Y direction perpendicular to each other. This stage device 10 is constituted by an X-direction stage 2 constituted on a top surface of a vibration isolating table 1, a Y-direction stage 3 provided movably in the X direction on the X-direction stage 2 and a wafer stage 4 provided movably in the Y direction perpendicular to the X direction on the Y-direction stage 3.

The vibration isolating table 1 is disposed on a base (not shown) and is provided with a vibration isolating structure for not transmitting external vibration to the X-direction stage 2. The X-direction stage 2 is constituted by linear motors 5a, 5b as examples of a pair of thrust generating means in parallel to the X direction. In more detail, the X-direction stage 2 is constituted by stators 51a, 51b of the linear motors 5a, 5b attached to the top surface of the vibration isolating table 1 movably in the X direction via guide members 6a, 6b.

The Y-direction stage 3 is provided with linear motors 7a, 7b as examples of a pair of thrust generating means in parallel to the Y direction perpendicular to the X direction. In more detail, the Y-direction stage 3 is constituted by stators 71a, 71b of a pair of linear motors 7a, 7b and movable elements 52a, 52b of the pair of linear motors 5a, 5b. That is, the Y-direction stage 3 is constituted by fixing the movable elements 52a, 52b of the pair of linear motors 5a, 5b on both Y-direction ends of the stators 71a, 71b of a pair of linear motors 7a, 7b disposed in parallel to each other with a predetermined gap therebetween. The wafer stage 4 is constituted by fixing movable elements 72a, 72b of the pair of linear motors 7a, 7b on both X-direction ends thereof and a wafer is mounted on a top surface thereof.

With this constitution, the Y-direction stage 3 is moved in the X direction on the X-direction stage 2 by thrusts supplied from the pair of linear motors 5a, 5b. The wafer stage 4 is moved in the Y direction on the Y-direction stage 3 by thrusts supplied from the pair of linear motor 7a, 7b. When the Y-direction position of the wafer stage 4 is changed in the Y-direction stage 3, the weight distribution in the Y direction in the Y-direction stage 3 is changed. Therefore, the centroid position of the Y-direction stage 3 is displaced in the Y direction.

Although a wafer mounted on the wafer stage 4 is by nature an object to be positioned, the wafer position in an X-Y plane is displaced along with the wafer stage 4 in the stage device 10 constituted as described above since the wafer is placed while its position on the wafer stage 4 is fixed. Therefore, the wafer stage 4 is equivalent to an object to be positioned of the present invention. Similarly, the Y-direction stage 3 is equivalent to an object to be positioned.

Figure 2:
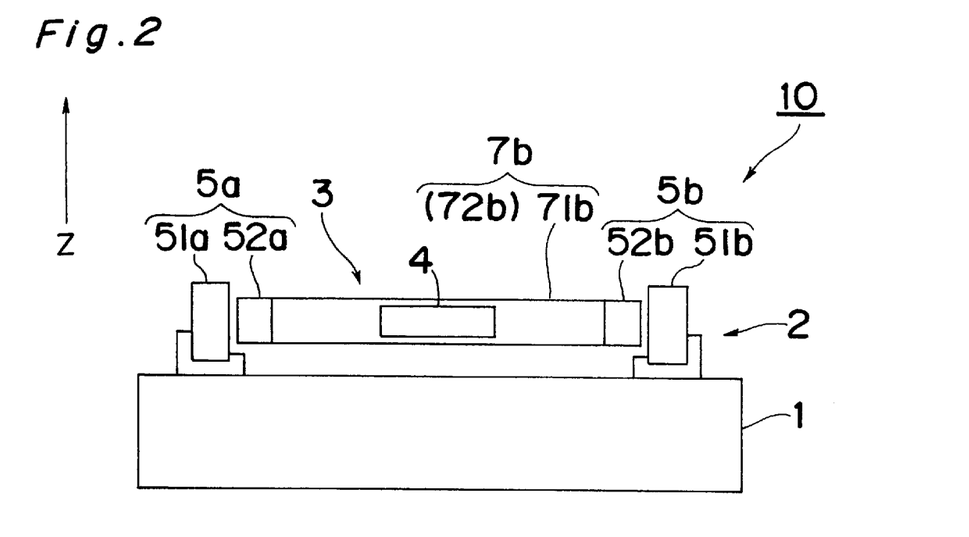
FIG. 2 is a cross section showing a structure of the stage device.

FIG. 2 is a cross section showing a structure of the stage device. In the stage device 10, the centroid position of the Y-direction stage 3 and the centroid position of the wafer stage 4 in a Z direction perpendicular to X direction and the Y direction are located at the same position as shown in FIG. 2. Also, the central positions of the stators 51a, 51b and the central positions of the movable elements 52a, 52b in the linear motors 5a, 5b coincide in the Z direction. The central positions of the stators 71a, 71b and the central positions of the movable elements 72a, 72b in the linear motors 7a, 7b coincide. In this constitution, the positions where the stators 51a, 51b are opposed to the movable elements 52a, 52b in the linear motors 5a, 5b are action points of the thrusts of the Y-direction stage 3. The positions where the stators 71a, 71b are opposed to the movable elements 72a, 72b in the linear motors 7a, 7b are action points of the moving force of the wafer stage 4.

Therefore, the action points of the thrusts from the linear motors 5a, 5b in the Y-direction stage 3 and the action points of the thrusts from the linear motors 7a, 7b in the wafer stage 4 are located at the same position in the Z direction.

Due to this constitution, moments in a pitching direction do not act on the Y-direction stage 3 and the wafer stage 4 when the Y-direction stage 3 travels in the X direction on the X-direction stage 2 and the wafer stage 4 travels in the Y direction on the Y-direction stage 3.

Figure 3:
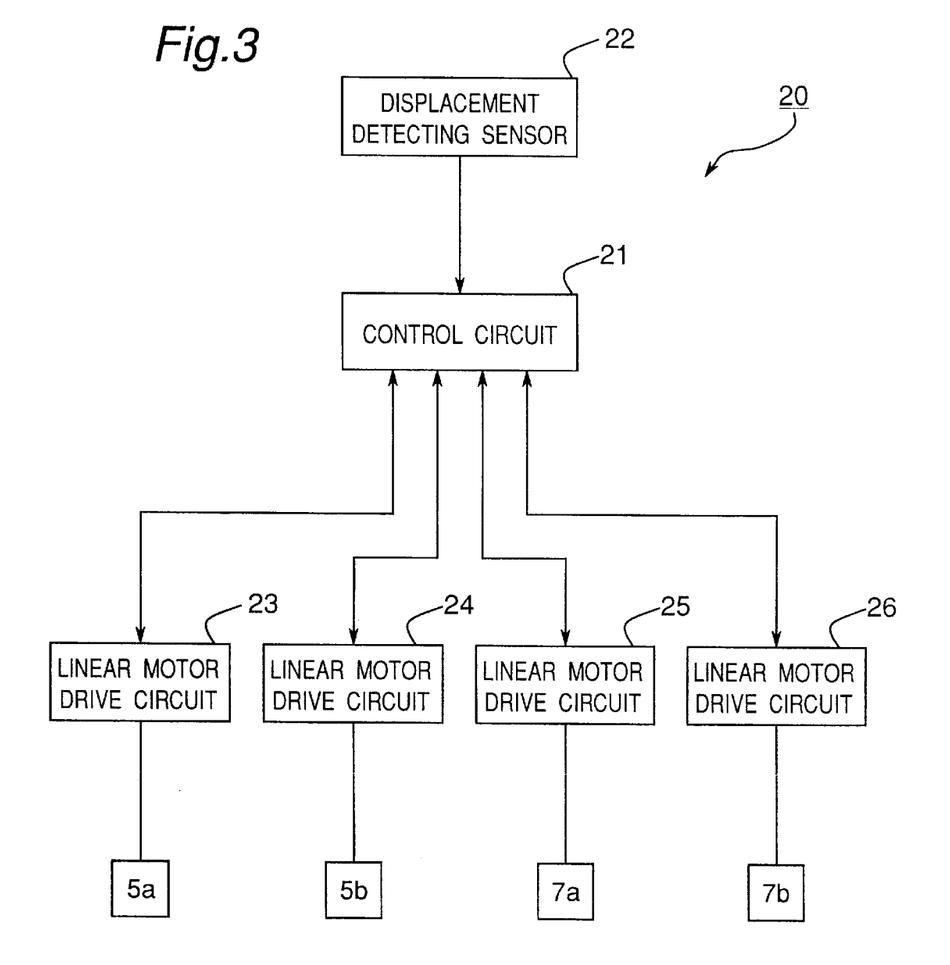
FIG. 3 is a block diagram showing a configuration of a control section of the stage device.

FIG. 3 is a block diagram showing a configuration of a control section of the stage device. The control section 20 of the stage device 10 is constituted by connecting a displacement detecting sensor 22 and linear motor drive circuits 23–26 to a control circuit 21 constituted by a micro computer. The displacement detecting sensor 22 is constituted by a laser interferometer or the like and detects the position of the wafer stage 4 in the Y direction and its travelling speed in the Y-direction stage 3. The linear motors 5a, 5b, 7a, 7b are connected to the linear motor drive circuits 23–26, respectively. Target position data is inputted in the control circuit 21 via an input circuit (not shown). This target position data is data for specifying a place where a wafer placed on the wafer stage 4 in the X-Y plane of the stage device 10 needs to be positioned.

The control circuit 21 performs feedback-controls of movement of the Y-direction stage 3 provided with the movable elements 52a, 52b of the linear motors 5a, 5b and the wafer stage 4 provided with the movable elements 72a, 72b of the linear motors 7a, 7b by outputting drive data to the linear motor drive circuits 23–26 based on detection data from the displacement detecting sensor 22 and positions the wafer placed on the wafer stage 4 at a target position. The linear motor drive circuits 23–26 supply current to the stators 51a, 51b, 71a, 71b of the linear motors 5a, 5b, 7a, 7b depending on the drive data outputted from the control circuit 21. It is noted that current may be supplied to the movable elements 52a, 52b, 72a, 72b.

The displacement detecting sensor 22 needs to be a sensor at least capable of detecting at least the position of the wafer stage 4.

Figure 4:
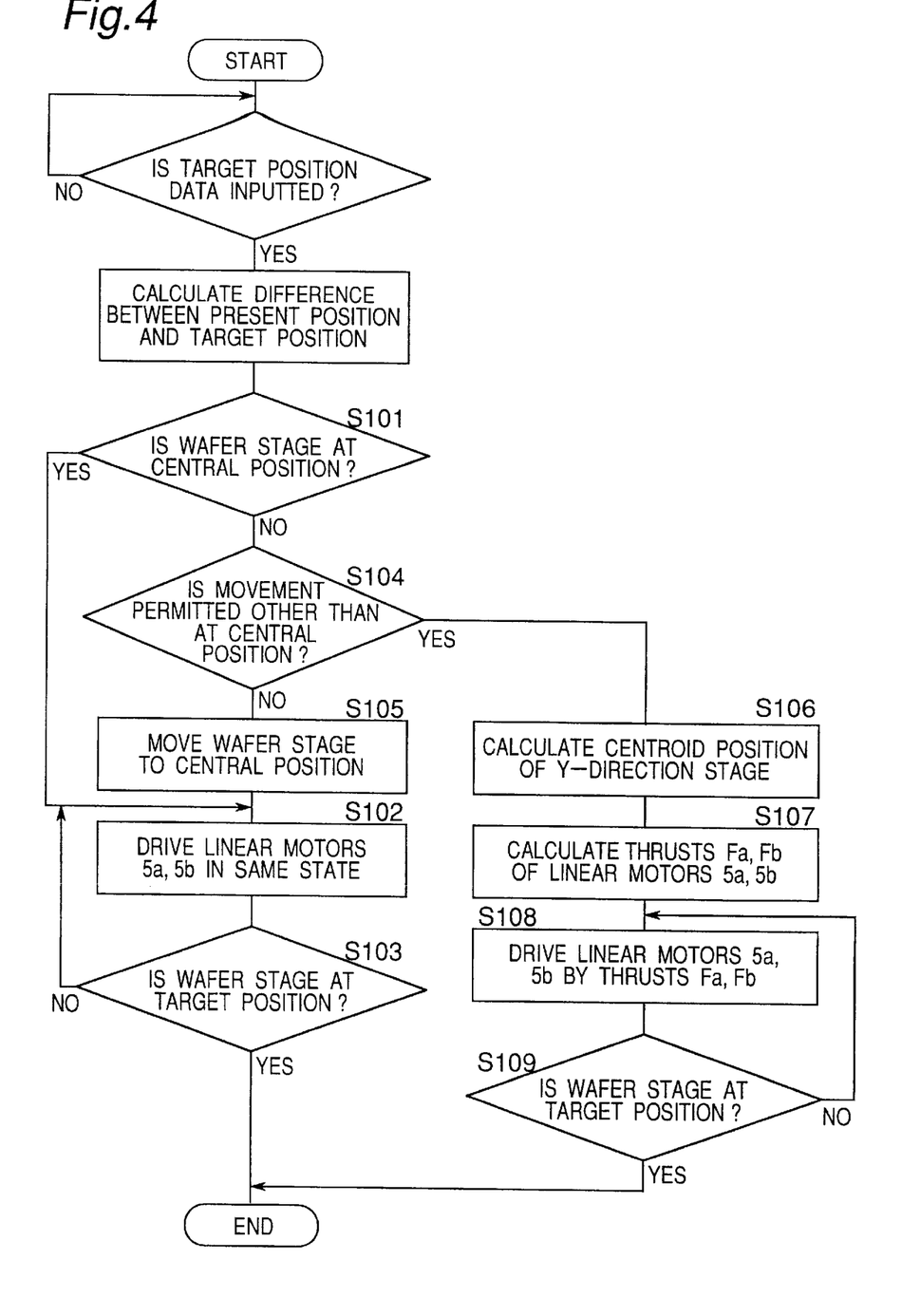
FIG. 4 is a flow chart showing part of processing procedures in the control section of the stage device.

FIG. 4 is a flow chart showing part of processing procedures in the control section of the stage device. When target position data is inputted, the control circuit 21 constituting the control section 20 of the stage device 10 calculates a difference between the present position and the target position of a wafer in the X-Y plane of the stage device 10 and drives the linear motors 5a, 5b, 7a, 7b via the linear motor drive circuits 23–26 based on this difference. At this time, when the linear motors 5a, 5b are driven to move the Y-direction stage 3 in the X direction, the control circuit 21 judges whether the wafer stage 4 is located at a position by which the centroid of the Y-direction stage 3 in the Y-direction traveling range in the Y-direction stage 3 is positioned at the center between the linear motors 5a, 5b (S101).

In the stage device 10, the Y-direction stage 3 and the wafer stage 4 are constituted symmetrically about the Y direction and the movable elements 52a, 52b of the linear motors 5a, 5b are attached to both Y-direction ends of the Y-direction stage 3. Therefore, as long as the wafer is placed at the central portion in the wafer stage 4, the centroid of the Y-direction stage 3 is positioned at the center between the linear motors 5a, 5b in a state that the wafer stage 4 is positioned at the central portion in the Y-direction traveling range.

When the wafer stage 4 is positioned at the central portion in the Y-direction traveling range, the control circuit 21 drives the linear motors 5a, 5b in the same state based on a difference between the present position and the target position of the wafer stage 4 in the X direction via the linear motor drive circuits 23, 24 (S102) and moves the wafer stage 4 to the target position together with the Y-direction stage 3 by acting equal thrusts on the both ends of the Y-direction stage 3 (S103).

When the wafer stage 4 is not positioned at the central portion in the Y-direction traveling range, the control circuit 21 judges whether a processing of moving the wafer stage 4 to the center in the Y-direction traveling range is permitted before movement of the Y-direction stage 3 (S104). When the processing of moving the wafer stage 4 to the center in the Y-direction traveling range before moving the Y-direction stage 3 is permitted in advance, the control circuit 21 drives the linear motors 7a, 7b via the linear motor drive circuits 25, 26 based on a difference between the present position of the wafer stage 4 in the Y direction and the central position in the Y-direction traveling range, moves the wafer stage 4 to the center in the Y-direction traveling range (S105) and then moves the Y-direction stage 3 in the X direction (S105→S102, S103).

If movement of the wafer stage 4 in the Y direction is permitted other than at the central position in the traveling range, the control circuit 21 calculates the centroid position of the Y-direction stage 3 based on the present position of the wafer stage 4 in the Y direction (S106), obtains a thrust to be generated in each of the linear motors 5a, 5b to move the Y-direction stage 3 without acting moments about the centroid based on this calculation result (S107) and further moves the Y-direction stage 3 by supplying current to the linear motors 5a, 5b to achieve this thrust (S108, S109).

By the above-described processings S101–S105, the control section 20 of the stage device 10 moves the Y-direction stage 3 in the X direction in a state that the wafer stage 4 affecting the centroid position of the Y-direction stage 3 in the Y direction perpendicular to the traveling direction (X direction) is positioned at the center in the Y-direction traveling range. Consequently, thrusts Fa, Fb of the same magnitude are supplied to the Y-direction stage 3 from each of the linear motors 5a, 5b in a state that the centroid of the Y-direction stage 3 in the Y direction is positioned at the central portion in the gap between a pair of linear motors 5a, 5b supplying thrusts in the X direction to the Y-direction stage 3. Therefore, moments Ma, Mb obtained by multiplying each of the thrusts Fa, Fb supplied from the linear motors 5a, 5b by distances La, Lb from the centroid of the Y-direction stage 3 to the linear motors 5a, 5b act about the centroid of the Y-direction stage 3.

Here, since the thrusts Fa, Fb are equal to each other and the distances La, Lb are equal to each other, the moments Ma, Mb are equal in magnitude. Since the linear motors 5a, 5b are opposed to each other about the centroid of the Y-direction stage 3, the moments Ma, Mb act in opposite directions about the centroid of the Y-direction stage 3. Therefore, the moments Ma, Mb cancel each other. The thrusts Fa, Fb do not act as forces for rotating the Y-direction stage 3 and thereby the Y-direction stage 3 is not deflected in a yawing direction.

By the above processings S106–S109, the control section 20 of the stage device 10 makes difference between the thrusts Fa, Fb supplied from a pair of linear motors 5a, 5b to the Y-direction stage 3 when the Y-direction stage 3 travels in the X direction in a state that the wafer stage 4 is not positioned at the center in the Y-direction traveling range, determines the magnitudes of the moments Ma, Mb about the centroid of the Y-direction stage 3 by the thrusts Fa, Fb so as to cancel each other, and moves the Y-direction stage 3 in the X direction. That is, the control section 20 obtains the centroid position of the Y-direction stage 3 in the Y direction based on the detection result of a position of the wafer stage 4 in the Y-direction traveling range obtained by the displacement detecting sensor 22 and moves the Y-direction stage 3 in the X direction by driving the linear motors 5a, 5b so as to generate thrusts Fa, Fb calculated by the following equations by using distances La, Lb from the obtained centroid position to the linear motors 5a, 5b:

$$Fa = F \times Lb/(La+Lb) \qquad \text{Eq. 1}$$

$$Fb = F \times La/(La+Lb) \qquad \text{Eq. 2}$$

It is noted that F is a thrust required to move the Y-direction stage 3 to a target position and a resultant force of the thrusts Fa, Fb in Equations 1, 2.

Consequently, the moments Ma, Mb generated about the centroid of the Y-direction stage 3 are made equal in magnitude by the thrusts Fa, Fb supplied to the Y-direction stage 3. Therefore, the moments Ma, Mb cancel each other and the thrusts Fa, Fb do not act as forces for rotating the Y-direction stage 3. Thus, the Y-direction stage 3 is not deflected in a yawing direction.

Figure 5A:
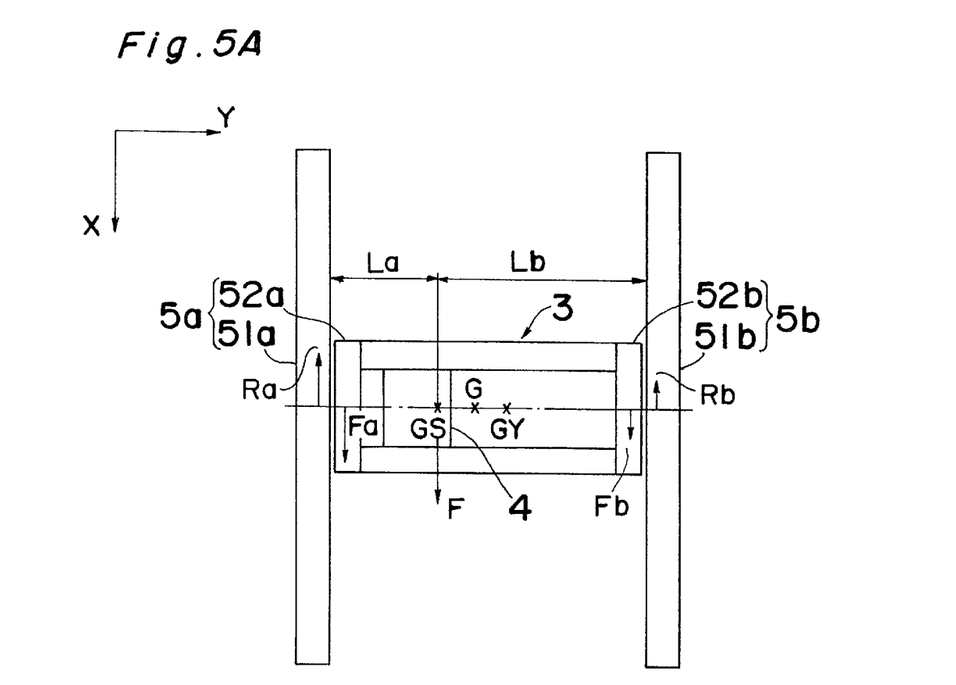
FIGS. 5A and 5B show a state of the centroid position of the whole stage device before and after movement of a Y-direction stage, respectively.
Figure 5B:
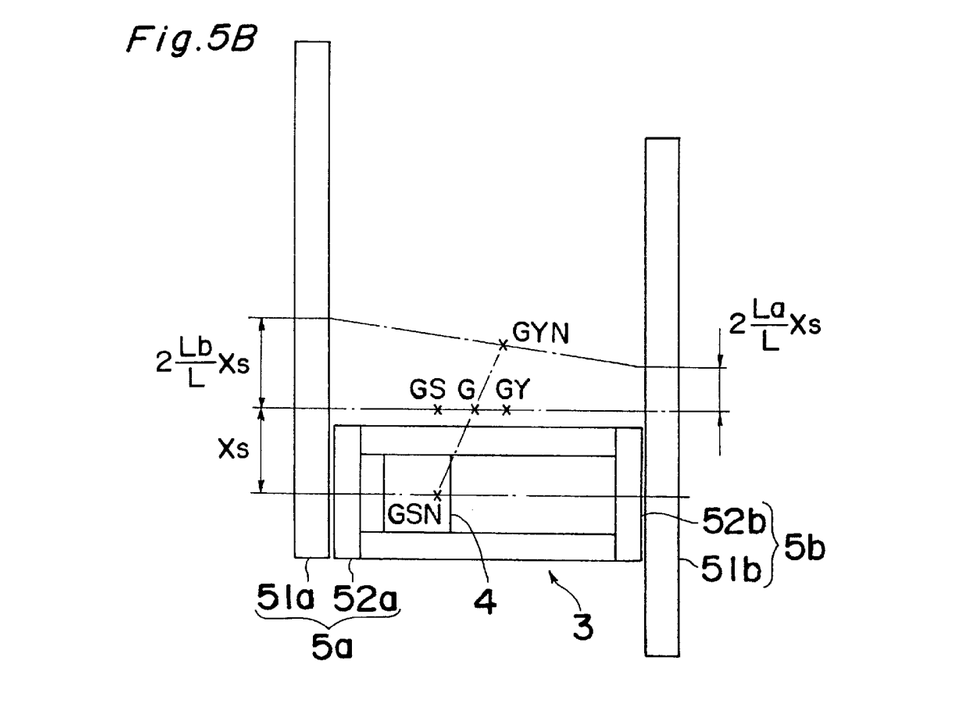

FIGS. 5A and 5B show states of the centroid position of the whole stage device described above before and after the movement of the Y-direction stage 3, respectively. When the Y-direction stage 3 travels, the stators 51a, 51b of the linear motors 5a, 5b receive reaction forces Ra, Rb from the movable elements 52a, 52b attached to the Y-direction stage 3. If a frictional resistance when the Y-direction stage 3 travels is ignored, these reaction forces Ra, Rb are:

$$Ra = -Fa$$

$$Rb = -Fb$$

In the stage device 10, the stators 51a, 51b of the linear motors 5a, 5b for supplying thrusts to the Y-direction stage 3 are supported movably in the same direction as the traveling direction of the Y-direction stage 3 by guide members 6a, 6b on the top surface of a vibration isolating table 1 as shown in FIG. 1. Therefore, when the reaction forces Ra, Rb act on the stators 51a, 51b of the linear motors 5a, 5b, the stators 51a, 51b travels in a direction opposite to the Y-direction stage 3 on the vibration isolating table 1 and thereby no vibration is generated in the vibration isolating table 1.

Thus, the stators 51a, 51b are moved on the vibration isolating table 1 by the reaction forces by the movement of the Y-direction stage 3 in the stage device 10. Therefore, the centroid positions of the stators 51a, 51b of the linear motors 5a, 5b are changed when the reaction forces of different magnitudes act on the stators 51a, 51b of the linear motors 5a, 5b by the above-described processings S106–S108. Consequently, the centroid position of the whole stage device 10 is displaced before and after the movement of the Y-direction stage 3 and thereby a possibility of vibrations generated in stage device 10 needs to be considered.

When the centroid position of the Y-direction stage 3 does not coincide with the central position in the gap between the linear motors 5a, 5b, the control section 20 allows the linear motors 5a, 5b to generate the thrusts Fa, Fb calculated by the above Equations 1, 2. As shown in FIG. 5A, when the distances La, Lb from the centroid position Gs of the Y-direction stage 3 to the linear motors 5a, 5b are La<Lb, Fa>Fb and Ra>Rb are obtained. Therefore, each of the linear motors 5a, 5b travels as shown in FIG. 5B after the movement of the Y-direction stage 3.

At this time, the shift Xs of the Y-direction stage 3 is obtained by $$Xs = \iint (F(t)/M) \cdot dt^2 Xs \cdot M = \iint F(t) dt^2 \quad \text{Eq. 3}$$

where M is the mass of the Y-direction stage 3. The shift Xa of the stator 51a of the linear motor 5a is obtained from the above Equations 1 and 3 by $$Xa = \iint (Fa(t)/Ma) \cdot dt^2 = (Lb/L) \cdot (M/Ma) Xs \quad \text{Eq. 4}$$

where Ma is the mass of the stator 51a. The shift Xb of the stator 51b of the linear motor 5b is obtained from the above Equations 2 and 3 by $$Xb = \iint (Fb(t)/Mb) \cdot dt^2 = (La/L) \cdot (M/Mb) \cdot Xs \quad \text{Eq. 5}$$

where Mb is the mass of the stator 51b.

Here, if Ma=Mb=M/2 is assumed, the centroid position Gyn of the stators 51a, 51b after the movement is at a position as moved by a shift Xs in a direction opposite to the centroid position Gsn of the Y-direction stage 3 by $$Xa = 2Xs \cdot (Lb/L)$$
$$Xb = 2Xs \cdot (La/L)$$
$$(Xa + Xb)/2 = Xs \cdot \{(Lb/L) + (La/L)\}$$
$$= Xs$$

as shown in FIG. 5B.

Thus, since the stators 51a, 51b are moved by the movement of the Y-direction stage 3 in a direction opposite to the Y-direction stage 3 by the same distance as the shift Xs of the Y-direction stage 3, the centroid G of the whole stage device 10 does not move. Therefore, no vibration is generated in the whole stage device 10 by the movement of the Y-direction stage 3 and the stators 51a, 51b. Thus, the wafer stage 4 can be precisely and smoothly moved to a target position.

Subsequently, if Ma=Mb=M/2 is not assumed, shifts Xa, Xb of the stators 51a, 51b are obtained from the above Equations 4, 5 by $$Xa = (M/Ma) \cdot (Lb/L) \cdot Xs \quad \text{Eq. 6}$$
$$Xb = (M/Mb) \cdot (La/L) \cdot Xs \quad \text{Eq. 7}$$

where Xs is a shift of the Y-direction stage 3. When a coordinate of the centroid position Gs of the Y-direction stage 3 before movement is (0, La), coordinates of the centroid positions Ga, Gb of the stators 51a, 51b are (0, 0), (0, L) and a coordinate of the centroid position G of the whole stage device is (X, Y), $$X = 0 \quad \text{Eq. 8}$$

is obviously obtained in the X direction. Also, due to the balance of the moments about the centroid, $$Ma \cdot Y + M(Y - La) + Mb(Y - L) = 0$$

is obtained. Consequently, $$Y = (M \cdot La + Mb \cdot L)/(M + Ma + Mb) \quad \text{Eq. 9}$$

is obtained in the Y direction.

On the other hand, the coordinate of the centroid position Gs of the Y-direction stage 3 after movement can be expressed as (Xs, La) and the coordinates of the centroid positions Ga, Gb of the stators 51a, 51b can be expressed as (−Xa, 0), (−Xb, L). At this time, the coordinate (X, Y) of the centroid position G of the whole stage device 10 is obtained from the balance of the moments about the centroid as $$Ma(X - Xa) + M(X + Xs) + Mb(X - Xb) = 0$$

If Equations 6, 7 are substituted in this equation, $$(M + Ma + Mb)X - M \cdot Xs(Lb/L) - MXs(La/L) + MXs = 0$$

is obtained. Consequently, $$X = 0 \quad \text{Eq. 10}$$

is obtained in the X direction.

$$Ma \cdot Y + M(Y - La) + Mb(Y - L) = 0$$

From the above equation, $$Y = (M \cdot La + Mb \cdot L)/(M + Ma + Mb) \quad \text{Eq. 11}$$

is obtained in the Y direction.

As a result, since Equation 8 is equal to Equation 10 and Equation 9 is equal to Equation 11, the coordinate of the centroid position G of the whole stage device 10 does not change before and after the movement. No vibration is generated in the whole stage device 10 by movement of the Y-direction stage 3 and the stators 51a, 51b and thereby the wafer stage 4 can be precisely and smoothly moved to a target position.

Figure 6:
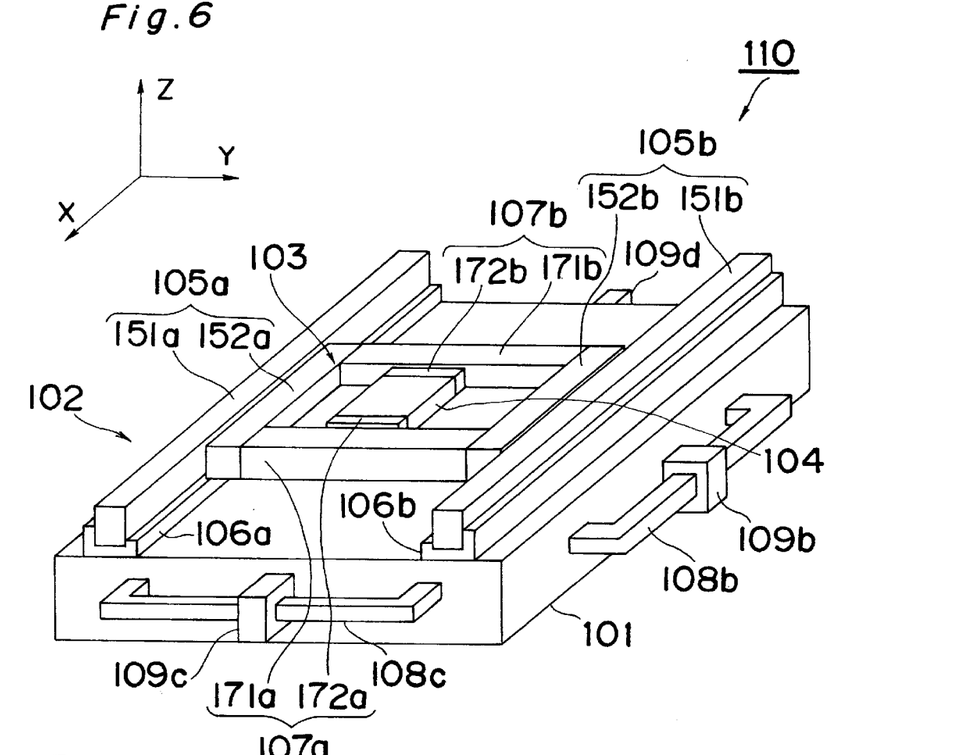
FIG. 6 is an external view showing a constitution of a stage device according to another embodiment of the invention.

FIG. 6 is an external view showing a constitution of a stage device according to another embodiment of the invention. A stage device 110 is applied to an aligner in use for a lithography process, in which a mask pattern is transferred to a substrate such as a wafer or the like, in manufacture of a semiconductor element, liquid crystal display element, thin film magnetic head or the like. A wafer is moved to an arbitrary target position in a predetermined range in an X direction and a Y direction perpendicular to each other. This stage device 110 is constituted by an X-direction stage 102 constituted on a top surface of a vibration isolating table 101 (equivalent to a base of the present invention), a Y-direction stage 103 provided movably in the X direction on the X-direction stage 102 and a wafer stage 104 provided movably in the Y direction perpendicular to the X direction on the Y-direction stage 103.

The vibration isolating table 101 is disposed on a fixed section (not shown) and is provided with a vibration isolating structure for not transmitting external vibration to the X-direction stage 102. The vibration isolating table 101 is provided with inertial bodies 109a–109d externally engaged to guides 108a–108d projected from four respective side surfaces thereof. The inertial bodies 109a, 109b are moved in an X direction in parallel to the traveling direction of the Y-direction stage 103 along the guides 108a, 108b by a drive mechanism provided in the vibration isolating table 101. The inertial bodies 109c, 109d are moved in an Y direction in parallel to the traveling direction of the wafer stage 104 along the guides 108c, 108d by the drive mechanism provided in the vibration isolating table 101.

The X-direction stage 102 is constituted by a pair of linear motors 105a, 105b in parallel to the X direction. In more detail, the X-direction stage 102 is constituted by stators 151a, 151b of the linear motors 105a, 105b attached to the top surface of the vibration isolating table 101 movably in the X direction via guide members 106a, 106b.

The Y-direction stage 103 is provided with a pair of linear motors 107a, 107b in parallel to the Y direction perpendicular to the X direction. In more detail, the Y-direction stage 103 is constituted by stators 171a, 171b of a pair of linear motors 107a, 107b and movable elements 152a, 152b of the pair of linear motors 105a, 105b. That is, the Y-direction stage 103 is constituted by fixing the movable elements 152a, 152b of the pair of linear motors 105a, 105b on both Y-direction ends of the stators 171a, 171b of the pair of linear motors 107a, 107b disposed in parallel to each other with a predetermined gap therebetween. A wafer stage 104 is constituted by fixing the movable elements 172a, 172b of the pair of linear motors 107a, 107b on both X-direction ends thereof and a wafer is mounted on a top surface thereof.

With this constitution, the Y-direction stage 103 is moved in the X direction on the X-direction stage 102 by thrusts supplied from the pair of linear motors 105a, 105b. The wafer stage 104 is moved in the Y direction on the Y-direction stage 103 by thrusts supplied from the pair of linear motor 107a, 107b. When the Y-direction position of the wafer stage 104 is changed in the Y-direction stage 103, the weight distribution in the Y direction in the Y-direction stage 103 is changed. Therefore, the centroid position of the Y-direction stage 103 is displaced in the Y direction.

Although a wafer mounted on the wafer stage 104 is by nature an object to be positioned, the wafer position in a X-Y plane is displaced along with the wafer stage 104 since the wafer is placed in the stage device 110 constituted as described above while its position on the wafer stage 104 is fixed. Therefore, the wafer stage 104 is equivalent to the object to be positioned of the present invention. Similarly, the Y-direction stage 103 is equivalent to an object to be positioned.

Figure 7:
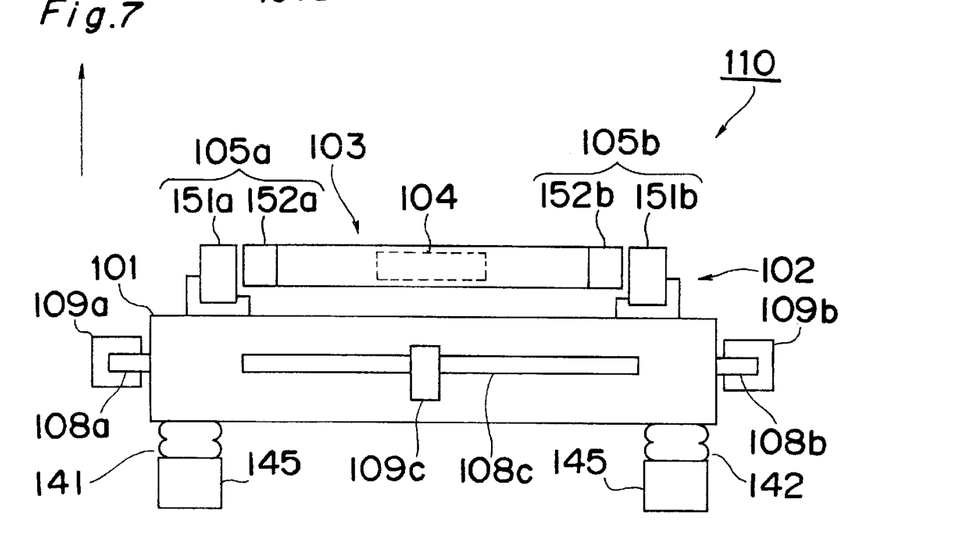
FIG. 7 is a side view showing a constitution of the stage device.

FIG. 7 is a side view showing a structure of the stage device as seen from the X direction. In the stage device 110, the centroid position of the Y-direction stage 103 and the centroid position of the wafer stage 104 are located at the same position in a Z direction perpendicular to the X direction and the Y direction as shown in FIG. 7. Also, the central positions of the stators 151a, 151b and the central positions of the movable elements 152a, 152b in the linear motors 105a, 105b coincide in the Z direction. The central positions of the stators 171a, 171b and the central positions of the movable elements 172a, 172b in the linear motors 107a, 107b coincide in the Z direction. In this constitution, the positions where the stators 151a, 151b are opposed to the movable elements 152a, 152b in the linear motors 105a, 105b are action points of the thrusts of the Y-direction stage 103. The positions where the stators 171a, 171b are opposed to the movable elements 172a, 172b in the linear motors 107a, 107b are action points of the moving forces of the wafer stage 104.

Therefore, the action points of the thrusts from the linear motors 105a, 105b in the Y-direction stage 103 and the action points of the thrusts from the linear motors 107a, 107b in the wafer stage 104 are located at the same position in the Z direction. Due to this constitution, moments in a pitching direction do not act on the Y-direction stage 103 and the wafer stage 104 when the Y-direction stage 103 travels in the X direction on the X-direction stage 102 and the wafer stage 104 travels in the Y direction on the Y-direction stage 103.

The vibration isolating table 101 is disposed on the fixed section 145 via supports 141–144. The supports 141–144 are disposed at four corners on the bottom surface of the vibration isolating table 101 in a plane in parallel to a plane on which the Y-direction stage 103 and the wafer stage 104 travel and buffers external vibration so that the vibration does not directly act on the vibration isolating table 101. Each of the supports 141–144 is constituted, for example, by air spring so that its bearing power can be increased or decreased individually by a pressure regulating mechanism.

Figure 8:
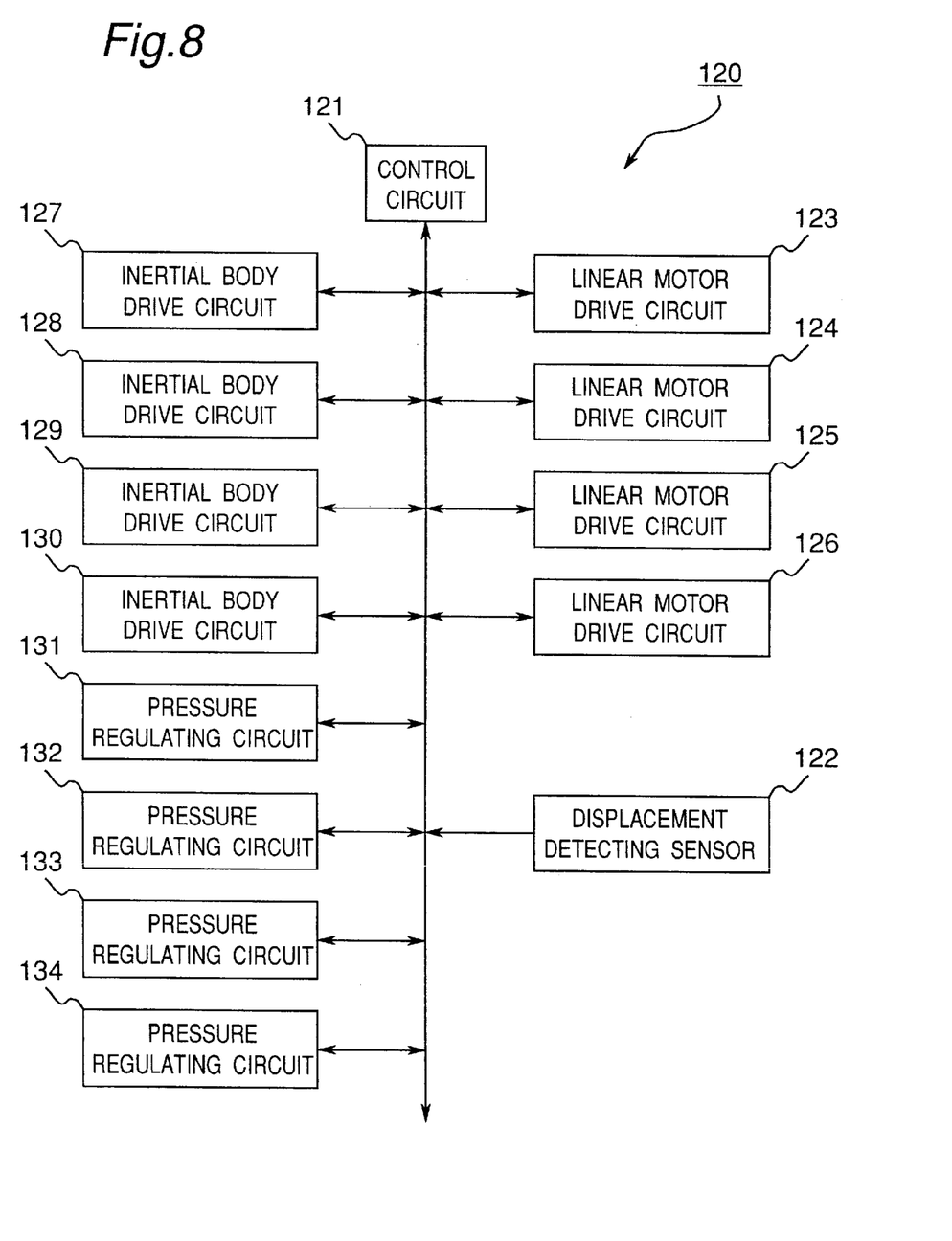
FIG. 8 is a block diagram showing a constitution of a control section of the stage device.

FIG. 8 is a block diagram showing a constitution of a control section of the stage device. The control section 120 of the stage device 110 is constituted by connecting a displacement detecting sensor 122, linear motor drive circuits 123–126, inertial body drive circuits 127–130 and pressure regulating circuits 131–134 to a control circuit 121 constituted by a micro computer. The displacement detecting sensor 122 is constituted by a laser interferometer or the like and detects the position of the wafer stage 104 in the Y direction and its travelling speed in the Y-direction stage 103. The linear motors 105a, 105b, 107a, 107b are connected to the linear motor drive circuits 123–126, respectively. A drive mechanism for driving each of inertial bodies 109a–109d is connected to each of the inertial body drive circuits 127–130. A pressure regulating mechanism for adjusting a bearing power of each of the supports 141–144 is connected to each of the pressure regulating circuits 131–134. Target position data is inputted in the control circuit 21 via an input circuit (not shown). This target position data is data for specifying a place to which a wafer placed on the wafer stage 4 needs to be positioned in the X-Y plane of the stage device 10.

The control circuit 121 performs feedback-control of movement of the Y-direction stage 103 provided with the movable elements 152a, 152b of the linear motor 105a, 105b and the wafer stage 104 provided with the movable elements 172a, 172b of the linear motors 107a, 107b by outputting drive data to the linear motor drive circuits 123–126 based on detection data from the displacement detecting sensor 122 and positions the wafer placed on the wafer stage 104 at a target position. The linear motor drive circuits 123–126 supply current to the stators 151a, 151b, 171a, 171b of the linear motors 105a, 105b, 107a, 107b depending on the drive data outputted from the control circuit 121. The control circuit 121 supplies predetermined thrusts to the inertial bodies 109a–109d via a drive mechanism by outputting drive data to the inertial body drive circuits 127–130 depending on the drive data to the linear motor drive circuits 123–126. Furthermore, the control circuit 121 adjusts the bearing powers of the supports 141–144 via the pressure regulating mechanism by outputting adjustment data to the pressure regulating circuits 131–134 depending of the centroid position of the vibration isolating table 101.

The displacement detecting sensor 122 needs to be a sensor at least capable of detecting at least the position of the wafer stage 104.

Figure 9:
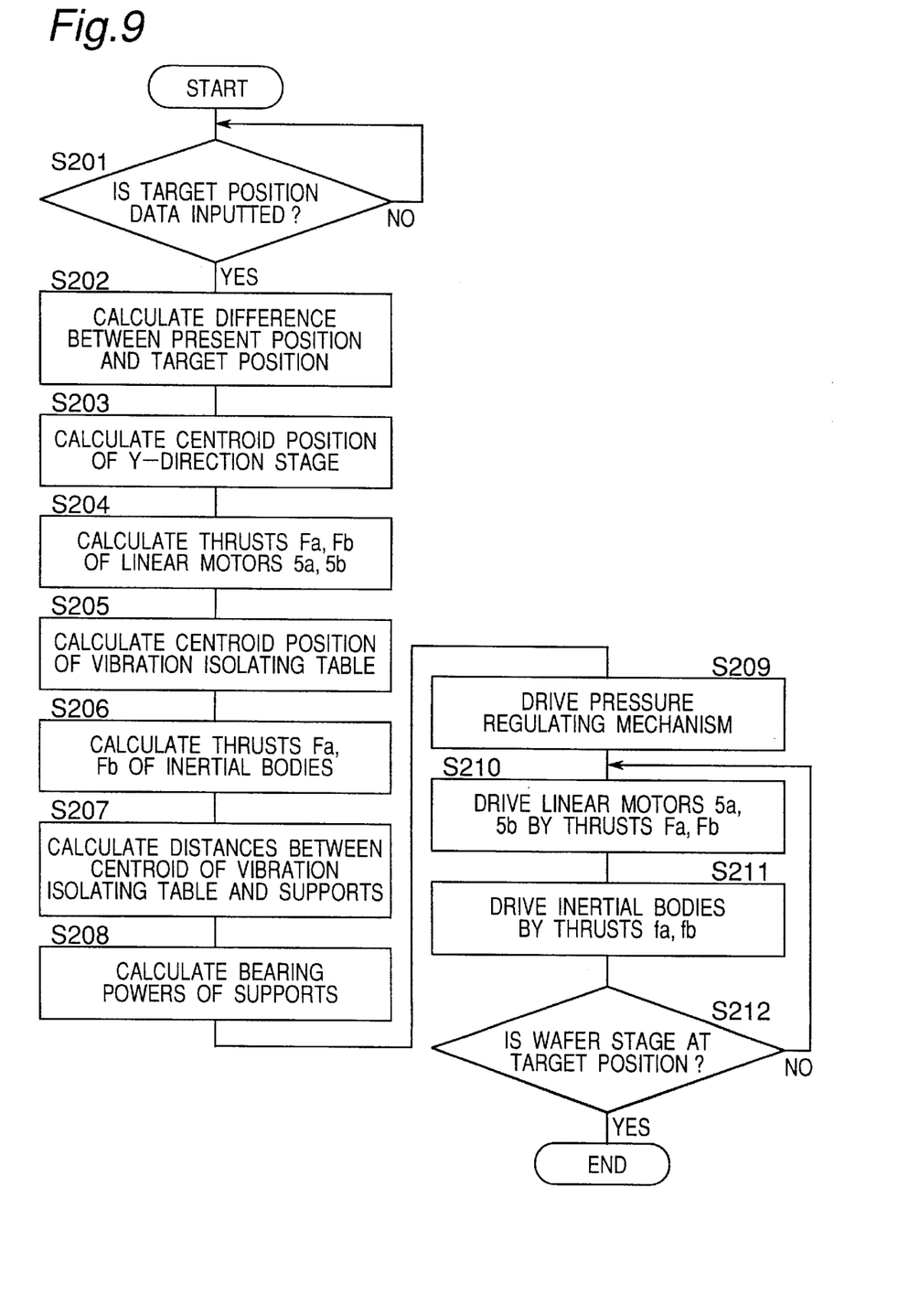
FIG. 9 is a flow chart showing part of processing procedures in the control section of the stage device.
Figure 10:
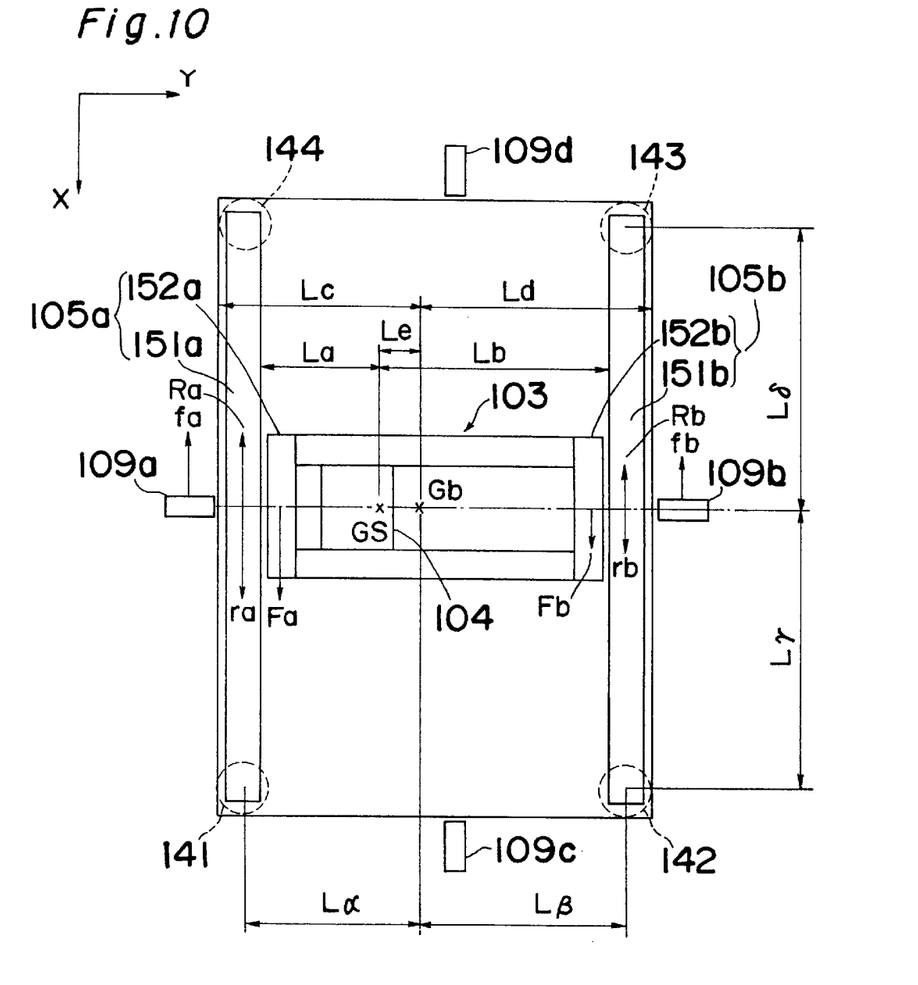
FIG. 10 is a plan view showing a position of each section of the stage device when the stage travels.

FIG. 9 is a flow chart showing part of processing procedures in the control section of the stage device. FIG. 10 is a plan view showing a position of each portion when the stage of the stage device travels. When target position data is inputted (S201), the control circuit 121 constituting the control section 120 of the stage device 110 calculates a difference between the present position and the target position of a wafer in the X-Y plane of the stage device 110 (S202) and drives the linear motors 105a, 105b, 107a, 107b via the linear motor drive circuits 123–126 based on this difference. At this time, the control circuit 121 calculates the centroid position Gs of the Y-direction stage 103 based on the present position of the wafer stage 104 in the Y direction (S203), obtains distances La, Lb from the obtained centroid position to the linear motors 105a, 105b and obtains thrusts Fa, Fb to be generated in each of the linear motors 105*a*, 105*b* to move the Y-direction stage 103 without allowing moments about the centroid by $$Fa = F \times Lb/(La+Lb) \qquad \text{Eq. 21}$$

$$Fb = F \times La/(La+Lb) \qquad \text{Eq. 22}$$

by using these distances La, Lb (S204).

At the same time, the control circuit 121 obtains the centroid position Gb of the vibration isolating table 101 including the Y-direction stage 103 and the wafer stage 104 based on the positions of Y-direction stage 103 and the wafer stage 104 (S205) and then obtains thrusts fa, fb to be supplied to the inertial bodies 109*a*, 109*b* based on the thrusts Fa, Fb to be generated by the linear motors 105*a*, 105*b* by $$fa = -(Fa+Fb)\{(Ld+Le)/(Lc+Ld)\} \qquad \text{Eq. 23}$$

$$fb = -(Fa+Fb)\{(Lc-Le)/(Lc+Ld)\} \qquad \text{Eq. 24}$$

where Le is a distance from the centroid position Gs of the Y-direction stage 103 to the centroid position Gb of the vibration isolating table 101 and Lc and Ld are distances from the thrust generating positions to the inertial bodies 109*a*, 109*b* to the centroid position Gb of the vibration isolating table 101 (S206).

Furthermore, the control circuit 121 obtains distances Lα, Lβ, Lγ, Lδ from the centroid position Gb to each of the supports 141–144 of the vibration isolating table 101 (S207) and calculates bearing powers Fα, Fβ, Fγ, Fδ of the supports 141–144 based on the distances Lα, Lβ, Lγ, Lδ and the weight W of the vibration isolating table 101 including the Y-direction stage 103 and the wafer stage 104 by $$F\alpha = \{L\beta/(L\alpha+L\beta)\}\{L\delta/(L\gamma+L\delta)\}W \qquad \text{Eq. 25}$$

$$F\beta = \{L\alpha/(L\alpha+L\beta)\}\{L\delta/(L\gamma+L\delta)\}W \qquad \text{Eq. 26}$$

$$F\gamma = \{L\alpha/(L\alpha+L\beta)\}\{L\gamma/(L\gamma+L\delta)\}W \qquad \text{Eq. 27}$$

$$F\delta = \{L\beta/(L\alpha+L\beta)\}\{L\gamma/(L\gamma+L\delta)\}W \qquad \text{Eq. 28}$$

(S208).

The control circuit 121 operates the pressure regulating mechanism so that the bearing powers Fα, Fβ, Fγ, Fδ obtained by the above Equations 25–28 are achieved (S209), supplies current for achieving the thrusts Fa, Fb obtained by the above Equations 21 and 22 to the linear motors 105*a*, 105*b* and moves the Y-direction stage 103 until the wafer stage 104 reaches a target position in the X direction (S210, S211). At the same time, while the Y-direction stage 104 is traveling, the control circuit 121 supplies electric power for achieving the thrusts Fa and Fb obtained by the above Equations 23 and 24 to the drive mechanism and moves the inertial bodies 109*a*, 109*b* (S212).

By the above-described processings, the control section 120 of the stage device 110 adjusts the respective bearing powers of the supports 141–144 depending on the centroid position Gb of the vibration isolating table 101 including the Y-direction stage 103 and the wafer stage 104 and then moves the Y-direction stage 103 in the X direction. Therefore, the Y-direction stage 103 can be moved in a state that the vibration isolating table 101 is stable. The vibration isolating table 101 is not tilted or vibrated by the movement of the Y-direction stage 103 and thereby the Y-direction stage 103 can be smoothly moved.

When the Y-direction stage 103 travels in the X direction, the control section 120 makes a difference between the thrusts Fa, Fb supplied from a pair of linear motors 105*a*, 105*b* to the Y-direction stage 103 depending on the distances from the centroid position Gs of the Y-direction stage 103 in the Y direction to the action points of the thrusts of the linear motors 105*a*, 105*b* and moves the Y-direction stage 103 in the X direction so that moments Ma, Mb about the centroid of the Y-direction stage 103 by the thrusts Fa, Fb cancel each other. Consequently, the moments Ma, Mb about the centroid of the Y-direction stage 103 are made equal in magnitude by the thrusts Fa, Fb supplied to the Y-direction stage 103. Therefore, the moments Ma, Mb cancel each other and the thrusts Fa, Fb do not act as forces for rotating the Y-direction stage 103. Thus, the Y-direction stage 103 is not deflected in a yawing direction.

Furthermore, while the Y-direction stage 103 is traveling, the control section 120 moves the inertial bodies 109*a*, 109*b* in a direction opposite to the traveling direction of the Y-direction stage 103 by the thrusts fa, fb depending on the reaction forces acting on the vibration isolating table 101 via the stators 151*a*, 151*b*. That is, as shown in FIG. 10, the thrusts Fa, Fb are supplied on both ends of the Y-direction stage 103 depending on the centroid position Gs of the Y-direction stage 103. Reaction forces Ra, Rb depending on the thrusts Fa, Fb act on the vibration isolating table 101 via the stators 151*a*, 151*b*. By moving the inertial bodies 109*a*, 109*b* by the thrusts Fa, Fb depending on these reaction forces Ra, Rb, reaction forces ra, rb by the movement of the inertial bodies 109*a*, 109*b* act on the vibration isolating table 101 and cancel the reaction forces Ra, Rb. Consequently, when the Y-direction stage 103 travels, forces canceling angular moments generated in the base 101 by the reaction forces transmitted via the stators 151*a*, 151*b* of the linear motors 105*a*, 105*b* act from the inertial bodies 109*a*, 109*b* on the base 101. Therefore, when the Y-direction stage 103 travels, yawing is not caused in the base 101 in a plane in parallel to the traveling plane of the Y-direction stage 103.

By moving the Y-direction stage 103 under a condition that the wafer stage 104 is positioned in the center in the traveling range, that is, the centroid of the Y-direction stage 103 is positioned in the center in the Y direction, this control may be simplified so that the thrusts Fa, Fb to be supplied to the linear motors 105*a*, 105*b* are made equal to each other at all times and that the thrusts Fa, Fb to be supplied to the inertial bodies 109*a*, 109*b* are made equal to each other at all times.

When the wafer stage 104 travels in the Y direction, reaction forces are transmitted to the base 101 via the stators 171*a*, 171*b* of the linear motors 107*a*, 107*b* constituting the Y-direction stage 103 and the stators 151*a*, 151*b* of the linear motors 105*a*, 105*b*. The inertial bodies 109*c*, 109*d* are moved in the Y direction so that moments generated about the centroid of the base 101 are canceled by these reaction forces.

Furthermore, since the moments about the centroid in the same plane are allowed to act on the base 101 by moving the inertial bodies 109*a*–109*d*, moving the four inertial bodies may be substituted by moving three or less inertial bodies and at least one inertial body needs to be provided in the base 101.

Figure 11:
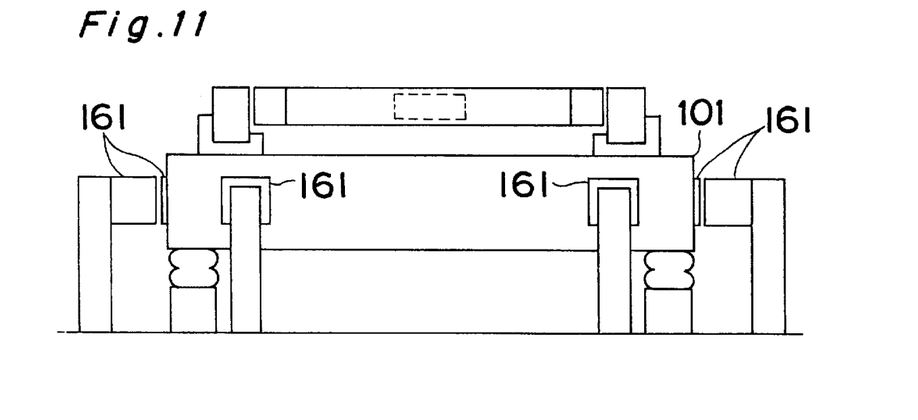
FIG. 11 is a side view showing a constitution of a stage device according to another embodiment of the invention.

As shown in FIG. 11, by constituting a travel mechanism of the inertial bodies 109*a*–109*d* by a linear motor 161 or the like so that the inertial bodies 109*a*–109*d* are not brought into direct contact with the base 101, the centroid position of the base 101 is not displaced by movement of the inertial bodies 109*a*–109*d* and thereby the control for regulating yawing of the base 101 is simplified.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A stage device which moves a stage on a support by thrusts generated by a pair of thrust generating means being in parallel to a stage traveling direction, wherein there is provided with a control section for moving the stage in a state that moments acted on the stage about the centroid are balanced by the thrust supplied from each of the pair of thrust generating means, wherein the control section calculates a thrust Fa of the thrust generating means on a distance La side and a thrust Fb of the thrust generating means on a distance Lb side by equations:

$$Fa = F \times Lb/(La+Lb)$$

$$Fb = F \times La/(La+Lb)$$

where F is a thrust required to move the stage and La and Lb are distances from the centroid position of the stage to positions where the respective thrusts of the pair of thrust generating means act.

2. The stage device according to claim 1, wherein the control section allows the centroid position of the stage to coincide with a central position in a direction perpendicular to the traveling direction before moving the stage.

3. The stage device according to claim 1, wherein:

the stage travels in one of two directions perpendicular to each other while an object to be positioned is placed movably in the other direction; there is provided a position detecting sensor for detecting a position of the object to be positioned in the stage; and the control section calculates a value of current to be supplied to each of the pair of thrust generating means for supplying a thrust in the other direction means for supplying a thrust in the other direction to the stage based on a detection result of the position detecting sensor.

4. The stage device according to claim 3, wherein the centroid position of the object to be positioned, the centroid position of the stage, the action point of the moving force against the object to be positioned and the action point of the thrust against the stage exist in a same plane having a normal line perpendicular to the traveling direction of the object to be positioned and the stage traveling direction.

5. The stage device according to claim 1, wherein the pair of thrust generating means for supplying thrusts to the stage have movable elements fixed to the stage and stators attached to the support movably in the stage traveling direction.

6. A stage device for linearly moving a stage via a guide fixed on a base, comprising:

a first thrust generating means for supplying a thrust depending on the centroid position of the stage to each of both end portions in a direction perpendicular to the stage traveling direction; and a second thrust generating means for acting a force on the base opposite to a reaction force transmitted from the first thrust generating means to the base when the stage travels, wherein the first thrust generating means determines or distributes a thrust Fa to be supplied to the end portion on a distance La side and a thrust Fb to be supplied to the end portion on a distance Lb side by equations:

$$Fa = F \times Lb/(La+Lb)$$

$$Fb = F \times La/(La+Lb)$$

where F is a thrust required to move the stage, La and Lb are distances from the centroid position of the stage to action points of the thrusts in both end portions thereof.

7. The stage device according to claim 6, wherein the second thrust generating means is an inertial body which is provided movably in a plane in parallel to a plane on which the stage travels in the base and receives a thrust supplied from the base.

8. The stage device according to claim 6, wherein the second thrust generating means travels in a plane in parallel to the plane on which the stage travels without contacting the base.

9. The stage device according to claim 8, wherein the second thrust generating means are disposed at two sites of the base and receive supplies of thrusts Fc, Fd determined and distributed by equations:

$$Fc = -Fx\{(Ld+Le)/(Lc+Ld)\}$$

$$Fd = -Fx\{(Lc-Le)/(Lc+Ld)\}$$

where Fx is a thrust required to move the stage, Le is a distance from the centroid position of the stage to the centroid position of the base and Lc and Ld are distances from thrust generating positions in the second thrust generating means to the centroid position of the base.

10. A stage device for linearly moving a stage via a guide fixed on a base, comprising:

a first thrust generating means for supplying a thrust depending on the centroid position of the stage to each of both end portions in a direction perpendicular to the stage traveling direction; and a second thrust generating means for acting a force on the base opposite to a reaction force transmitted from the first thrust generating means to the base when the stage travels, wherein the stage is composed of an x-direction stage and Y-direction stage traveling in directions perpendicular to each other; the first thrust generating means is composed of a first x-direction thrust generating means and a first y-direction thrust generating means for generating a thrust to be supplied to each of the x-direction stage and the y-direction stage; the second thrust generating means is composed of a second x-direction thrust generating means and a second y-direction thrust generating means for allowing forces opposite to reaction forces transmitted from the first x-direction thrust generating means and the first y-direction thrust generating means to the base to act on the base; and there are provided first to fourth supports holding the base at four sites in a plane in parallel to the plane on which the x-direction stage and the y-direction stage travels, and wherein bearing powers $F\alpha$, $F\beta$, $F\gamma$, $F\delta$ of the first to fourth supports are determined or distributed by equations:

$$F\alpha = \{L\beta/(L\alpha+L\beta)\}\{L\delta/(L\gamma+L\delta)\}W$$

$$F\beta = \{L\alpha/(L\alpha+L\beta)\}\{L\delta/(L\gamma+L\delta)\}W$$

$$F\gamma = \{L\alpha/(L\alpha+L\beta)\}\{L\gamma/(L\gamma+L\delta)\}W$$

$$F\delta = \{L\beta/(L\alpha+L\beta)\}\{L\gamma/(L\gamma+L\delta)\}W$$

Where W is a weight of the base including the x-direction stage and y-direction stage, $L\gamma$ and $L\delta$ are distances from the centroid position of the base to the two positions where the supports are disposed in the traveling direction of the x-direction stage and L$\alpha$ and L$\beta$ are distances from the centroid position of the base to the two positions where the supports are disposed in the traveling direction of the y-direction stage.

* * * * *